(12) United States Patent
Shin et al.

(10) Patent No.: US 7,973,590 B2
(45) Date of Patent: Jul. 5, 2011

(54) SEMICONDUCTOR DEVICE

(75) Inventors: Sang-Hoon Shin, Gyeonggi-do (KR);
Hyung-Dong Lee, Gyeonggi-do (KR);
Jun-Gi Choi, Gyeonggi-do (KR)

(73) Assignee: Hynix Semiconductor Inc.,
Gyeonggi-do (KR)

( * ) Notice: Subject to any disclaimer, the term of this patent is extended or adjusted under 35 U.S.C. 154(b) by 31 days.

(21) Appl. No.: 12/615,876

(22) Filed: Nov. 10, 2009

(65) Prior Publication Data

US 2011/0001552 A1  Jan. 6, 2011

(30) Foreign Application Priority Data

Jul. 1, 2009  (KR) .................. 10-2009-0059827

(51) Int. Cl.
*H01H 85/00*  (2006.01)

(52) U.S. Cl. ..................... 327/525; 327/565

(58) Field of Classification Search .......... 327/525, 327/564, 565
See application file for complete search history.

(56) References Cited

U.S. PATENT DOCUMENTS

| 7,413,980 B2 | 8/2008 | Guo et al. |
| 7,642,176 B2 * | 1/2010 | Cheng et al. ............... 438/467 |
| 2005/0285222 A1 * | 12/2005 | Thei et al. .................. 257/529 |

FOREIGN PATENT DOCUMENTS

| JP | 2006-253237 | 9/2006 |
| KR | 1020080046510 | 5/2008 |

OTHER PUBLICATIONS

J.J. Wang et al., "Total Dose and SEE of Metal-To-Metal Antifuse FPGA", Military and Aerospace Applications of Programmable Devices and Technologies Conference, 1999.
Notice of Preliminary Rejection issued from Korean Intellectual Property Office on Apr. 20, 2011.

* cited by examiner

*Primary Examiner* — Jeffrey S Zweizig
(74) *Attorney, Agent, or Firm* — IP & T Group LLP

(57) ABSTRACT

A semiconductor device includes a first transmission line and a second transmission line disposed at different layers; a contact fuse coupled with the first transmission line and the second transmission line; a power driver configured to apply an electric stress to the contact fuse; and a fuse state output unit configured to output a fuse state signal having a logic level corresponding to an electric connection state of the contact fuse.

29 Claims, 5 Drawing Sheets

SEMICONDUCTOR DEVICE

CROSS-REFERENCE TO RELATED APPLICATIONS

The present application claims priority of Korean Patent Application No. 10-2009-0059827, filed on Jul. 1, 2009, which is incorporated herein by reference in its entirety.

BACKGROUND OF THE INVENTION

Exemplary embodiments of the present invention relate to a semiconductor design technology, and more particularly, to a fuse circuit of a semiconductor device.

A semiconductor device includes a fuse circuit to set up an internal circuit, to change options of an internal circuit, or to program repair addresses. Predetermined setup information is changed or addresses are stored by changing electric connection states of fuses in the fuse circuit through fuse programming. The electric connection states of fuses are changed when a laser beam or an electric stress is applied to the fuses. That is, the electric resistance of fuses is changed if the laser beam or the electric stress is applied to the fuses. Therefore, predetermined data is programmed using the variation of electrical connection states of fuses such as a short state or an open state.

A laser blowing type fuse shorts an electric connection state of a fuse using a laser beam. The laser blowing type fuse is generally referred to as a physical fuse. The physical fuse changes an electrical connection state thereof using a laser beam in a wafer stage. Here, the wafer stage is a manufacturing stage before a semiconductor device is manufactured as a package. The physical fuse may be referred to as a laser fuse.

In a package stage, an electric method is used instead of using the physical method that uses a laser beam. A fuse that can be programmed in a package stage is referred to as an electrical fuse (E-Fuse). That is, the electrical fuse changes programming by changing an electric connection state of a fuse by applying electrical stress such as over-current or high voltage. The electrical fuse may be classified into an anti-type fuse and a blowing type fuse. The anti-type fuse changes an electric connection state from an open state to a short state, and the blowing type fuse changes an electric connection state from a short state to an open state. The electrical fuse is widely used in a package stage because the electrical fuse can be programmed after a package process. However, the electrical fuse is very large in size compared to the physical fuse and requires a control circuit for controlling fuses. Therefore, the electrical fuse is limited in an application range and in a setup capacity.

Therefore, there is a demand of developing a fuse having a small size like a physical fuse and having capability of performing a repair process even after packaging like an electrical fuse.

SUMMARY OF THE INVENTION

An embodiment of the present invention is directed to a semiconductor device having a contact fuse inserted in a contact hole.

In accordance with an embodiment of the present invention, a semiconductor device includes a first transmission line and a second transmission line disposed at different layers; a contact fuse coupled with the first transmission line and the second transmission line; a power driver configured to apply an electric stress to the contact fuse; and a fuse state output unit configured to output a fuse state signal having a logic level corresponding to an electric connection state of the contact fuse.

In accordance with another embodiment of the present invention, a semiconductor device includes a first transmission line; a second transmission line; a contact fuse coupled with the first transmission line and the second transmission line; a first signal driver configured to drive an input signal to the first transmission line; a second signal driver configured to drive the input signal to the second transmission line disposed at a layer different from a layer of the first transmission line; and a power driver configured to change an electric connection state of the contact fuse by applying an electric stress to the contact fuse.

In accordance with yet another embodiment of the present invention, a semiconductor device includes a first transmission line; a second transmission line; a main transmission line disposed at a layer different from layers of the first transmission line and the second transmission line; a first contact fuse coupled with the first transmission line and the second transmission line; a second contact fuse coupled with the second transmission line and the main transmission line; a first signal driver configured to drive an input signal to the first transmission line; a second signal driver configured to drive the input signal to the second transmission line; and a power driver configured to change an electric connection state of a selected contact fuse selected by selectively applying an electric stress to one of the first contact fuse and the second contact fuse as the selected contact fuse.

In accordance with still another embodiment of the present invention, a semiconductor device includes a first transmission line and a second transmission line; a laser fuse disposed at a layer different from layers of the first transmission line and the second transmission line; a contact fuse configured to connect the first transmission line with one end of the laser fuse; a connection line configured to connect the second transmission line with the other end of the laser fuse; a power driver configured to selectively apply an electric stress to the contact fuse; and a fuse state output unit configured to output a fuse state signal having a logic level corresponding to an electric connection state of the contact fuse.

In accordance with still yet another embodiment of the present invention, a semiconductor device includes a first transmission line, a second transmission line, and a third transmission line; a laser fuse disposed at a layer different from layers of the first transmission line, the second transmission line, and the third transmission lines; a first contact fuse configured to connect the first transmission line with one end of the laser fuse; a second contact fuse configured to connect the second transmission line with the other end of the laser fuse; a connection line coupled between the third transmission line and the one end of the laser fuse or between the third transmission line and the other end of the laser fuse; a power driver configured to selectively apply an electric stress to one of the first contact fuse and the second contact fuse; and a fuse state output unit configured to output a fuse state signal having a logic level corresponding to an electric connection state of the first and second fuses.

DESCRIPTION OF SPECIFIC EMBODIMENTS

Figure 1:
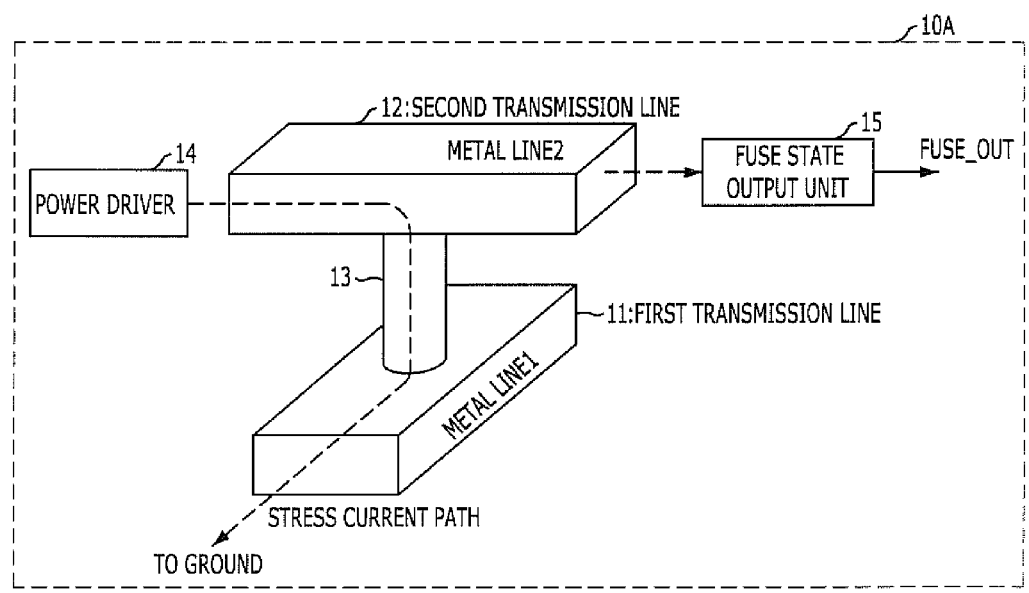
FIG. 1 illustrates a diagram 10A and an equivalent circuit diagram 10B of a semiconductor device according to a first embodiment of the present invention.
Figure 1:
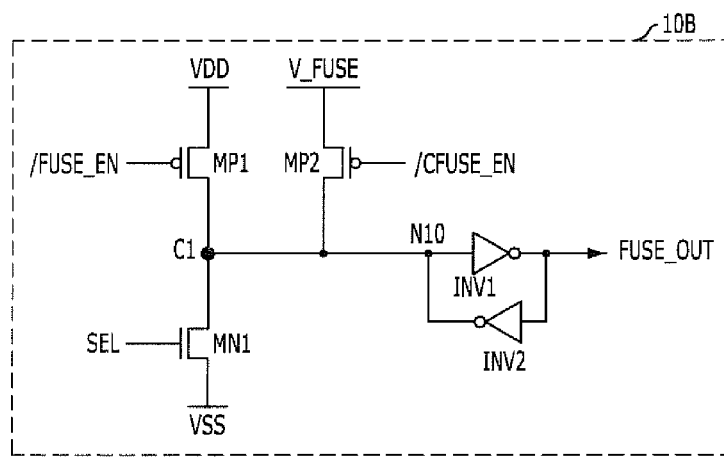

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In general, a logic signal of a circuit and a binary data value may be identified as a logic high level H or as a logic low level L corresponding to a voltage level. The logic signal may be expressed as '1' or '0'. If it is necessary, the logic signal or the binary data value may be defined or described as having additional state such as a high impedance state Hi-z. A P-channel metal oxide semiconductor (PMOS) and an N-channel metal oxide semiconductor (NMOS) in the specification are a metal oxide semiconductor field-effect transistor. A contact hole for connecting a metallic material with a non-metallic material may be distinguished from a via-hole for connecting a metallic material with a metallic material. However, in the present embodiment, a contact hole represents both of the contact hole and the via-hole.

FIG. 1 illustrates a semiconductor device in accordance with a first embodiment of the present invention. FIG. 1 includes a diagram 10A and an equivalent circuit diagram 10B of the semiconductor device according to the first embodiment.

Referring to FIG. 1, the semiconductor device according to the first embodiment includes a first transmission line 11 and a second transmission line 12 disposed in different layers, a contact fuse 13 disposed between the first and second transmission lines 11 and 12, a power driver 14 for applying an electric stress, and a fuse state output unit 15 for outputting a fuse state signal FUSE_OUT having a logic level corresponding to an electric connection state of the contact fuse 13 such as a short state or an open state.

The contact fuse 13 is inserted into a contact hole for connecting the first transmission line 11 with the second transmission line 12. Since the contact hole is surrounded with an insulating material, a temperature of the contact fuse 13 is abruptly increased by Joule heating when a stress current is applied. When the temperature increases more than a predetermined temperature, the contact fuse 13 is melted and finally discoupled. That is, the contact fuse 13 becomes an open state. For reference, the first and second transmission lines 11 and 12 are metallic transmission lines disposed on a metal layer.

Therefore, when the power driver 14 applies a stress current to the contact fuse 13 through a stress current path formed of the first and second transmission lines 11 and 12, a state of the contact fuse 13 is changed from a short state to an open state and a fuse state signal FUSE_OUT corresponding to the electric connection state of the contact fuse 13 is outputted.

Hereinafter, a structure and an operation of the semiconductor device according to the first embodiment will be described in detail with reference to the equivalent circuit diagram 10B.

The power driver 14 includes current drivers MP2 and MN1 for applying a stress current to a contact fuse C1 in response to a stress current driving signal /CFUSE_EN and a fuse selection signal SEL. When the current driving signal /CFUSE_EN is activated to a logic low level and the fuse selection signal SEL is activated to a logic high level, the PMOS transistor MP2 and the NMOS transistor MN1 are turned on. As a result, the stress current is applied to the contact fuse C1. If the stress current is applied for a predetermined time, the contact fuse C1 becomes an electric open state.

The fuse state output unit 15 includes fuse drivers MP1 and MN1 for providing a driving current to the contact fuse C1 in response to a fuse driving signal /FUSE_EN and the fuse selection signal SEL. The fuse state output unit 15 further includes latch units INV1 and INV2 for latching the fuse state signal FUSE_OUT corresponding to the magnitude of the current transferred through the contact fuse C1.

At an initial state such as a power up state, the stress current driving signal /CFUSE_EN is inactivated to a logic high level and the fuse selection signal SEL is inactivated to a logic low level. When the fuse driving signal /FUSE_EN is activated to a logic low level, the PMOS transistor MP1 is turned on. As a result, the driving current is applied to the contact fuse C1. The electric potential of an input node N10 of the latch units INV1 and INV2 is increased. Finally, the fuse state signal FUSE_OUT of a logic low level is outputted.

Then, if the fuse selection signal SEL is activated to a logic high level while the stress current driving signal /CFUSE_EN and the fuse driving signal /FUSE_EN are inactivated to a logic high level, the electric potential of the input node N10 of the latch units INV1 and INV2 is determined according to the electric connection state of the contact fuse C1. That is, if the contact fuse C1 is in the electric open state, the electric potential of the input node N10 of the latch units INV1 and INV2 are continually sustained in a logic high level. Finally, the fuse state signal FUSE_OUT of a logic low level is outputted. On the contrary, if the contact fuse C1 is in an electric short state, the electric potential of the input node N10 of the latch units INV1 and INV2 is decreased. Finally, the fuse state signal FUSE_OUT of a logic high level is outputted. That is, if the contact fuse C1 is in an electric open state, current does not flow through the contact fuse C1. Finally, the electric potential of the input node N10 of the latch units INV1 and INV2 is increased. If the contact fuse C1 is in an electric short state, the current flows to a ground voltage terminal VSS through the contact fuse C1. Therefore, the electric potential of the input node N10 of the latch units INV1 and INV2 is decreased.

Figure 2:
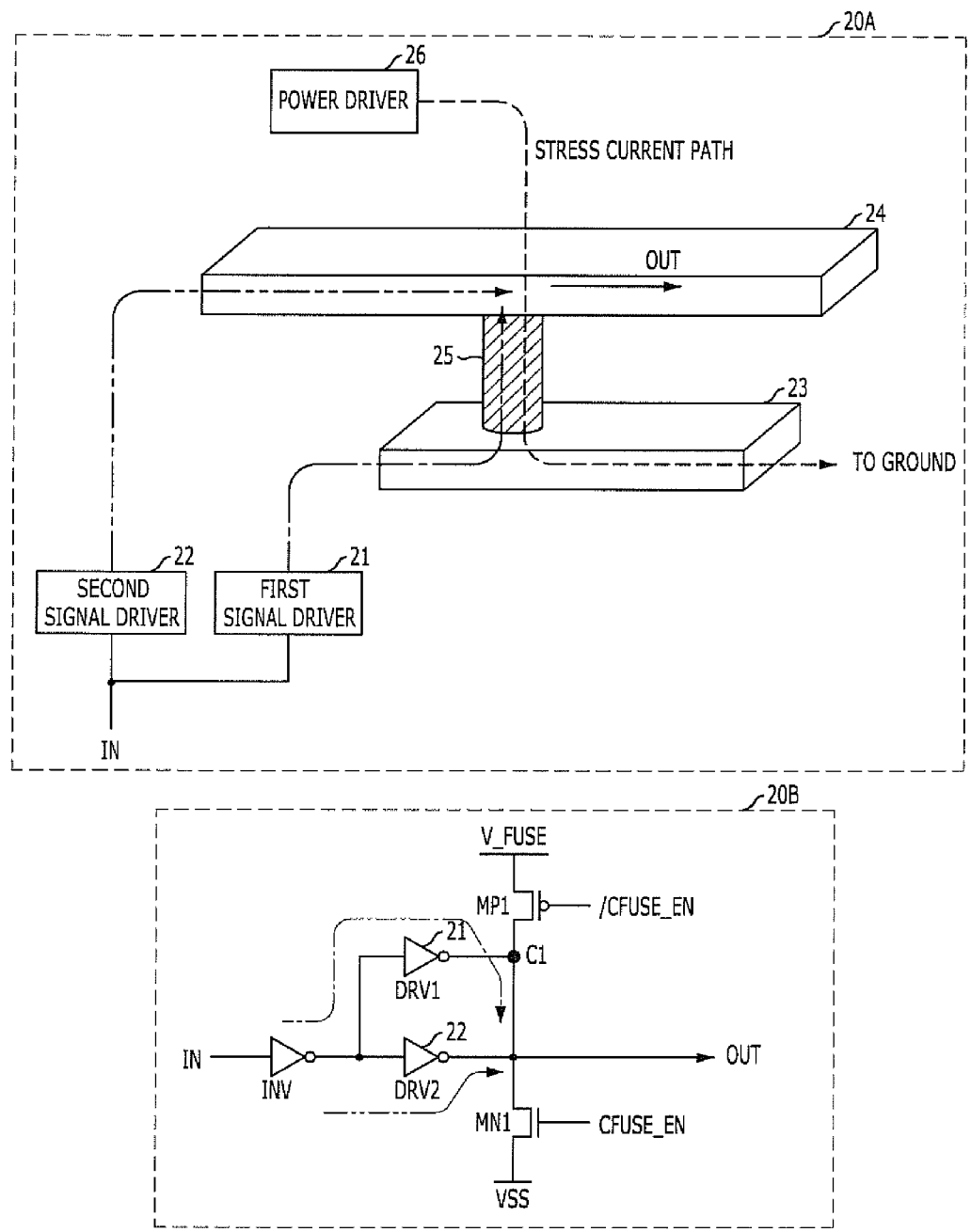
FIG. 2 illustrates a diagram 20A and an equivalent circuit diagram 20B of a semiconductor device in accordance with a second embodiment of the present invention.

FIG. 2 illustrates a semiconductor device in accordance with a second embodiment of the present invention. FIG. 2 includes a diagram 20A and an equivalent circuit diagram 20B of the semiconductor device according to the second present embodiment.

Referring to FIG. 2, the semiconductor device according to the second embodiment includes a first signal driver 21 for driving an input signal IN to a first transmission line 23, a second signal driver 22 for driving the input signal IN to a second transmission line 24 which is disposed at a layer different from that of the first transmission line 23, a contact fuse 25 coupled with the first transmission line 23 and the second transmission line 24, and a power driver 26 for applying an electric stress to the contact fuse 25 to change an electric connection state such as a short state or an open state of the contact fuse 25.

The contact fuse 25 is inserted into a contact hole for connecting the first transmission line 23 with the second transmission line 24. Since the contact hole is surrounded with an insulating material, a temperature of the contact fuse 25 is abruptly increased by Joule heating when the stress current is applied. When the temperature increases higher than a predetermined temperature, the contact fuse 25 is melted down and finally discoupled. That is, the contact fuse 25 becomes an electric open state. For reference, the first and second transmission lines 23 and 24 are metallic transmission lines disposed at metal layers.

Therefore, when the power driver 26 applies the stress current to the contact fuse 25 through a stress current path formed of the first and second transmission lines 23 and 24, the electric connection state of the contact fuse 25 changes from the short state to the open state. According to the electric connection state of the contact fuse 25, the driving force of a signal driven to the second transmission line 24 is controlled.

Hereinafter, a structure and an operation of the semiconductor device according to the second embodiment will be described in detail with reference to the equivalent circuit diagram 20B.

The power driver 26 includes current drivers MP1 and MN1 for applying a stress current to the contact fuse C1 in response to stress current driving signals /CFUSE_EN and CFUSE_EN. When the stress current driving signals /CFUSE_EN and CFUSE_EN are activated to a logic high level, the PMOS transistor MP1 and the NMOS transistor MN1 are turned on. As a result, the stress current is applied to the contact fuse C1. After the stress current is applied for a predetermined time, the contact fuse C1 becomes an electric open state.

Meanwhile, the first signal driver 21 drives the input signal IN to the first transmission line 23 and the second signal driver 22 drives the input signal IN to the second transmission line 24 which is disposed at a layer different from that of the first transmission line 23. Here, if the contact fuse C1 coupled with the first and second transmission lines 23 and 24 is in a short state, both of the input signals IN driven by the first and the second signal drivers 21 and 22 are transferred to the second transmission line 24. On the contrary, if the contact fuse C1 between the first and second transmission lines 23 and 24 is in an open state, the input signal IN driven by the first signal driver 21 is not transferred to the second transmission line 24. Only the input signal IN driven by the second signal driver 22 is transferred to the second transmission line 24. Therefore, the driving force of the signal to the second transmission line 24 is controlled according to the electric connection state of the contact fuse C1.

Figure 3:
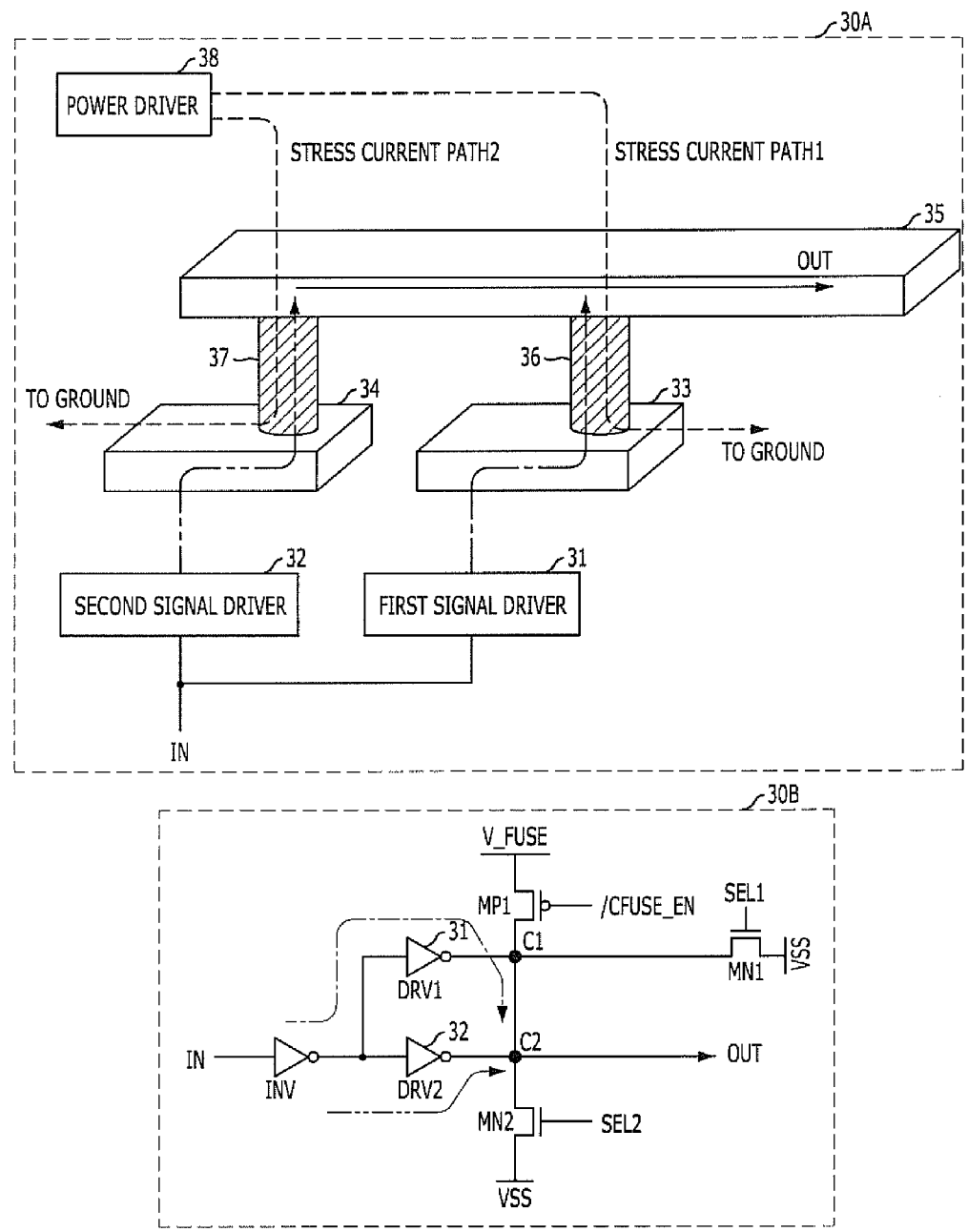
FIG. 3 illustrates a diagram 30A and an equivalent circuit diagram 30B of a semiconductor device in accordance with a third embodiment of the present invention.

FIG. 3 illustrates a semiconductor device in accordance with a third embodiment of the present invention. FIG. 3 includes a diagram 30A and an equivalent circuit diagram 30B of the semiconductor device according to the third embodiment.

Referring to FIG. 3, the semiconductor device according to the third embodiment includes a first signal driver 31 for driving an input signal IN to a first transmission line 33, a second signal driver 32 for driving an input signal IN to a second transmission line 34, an main transmission line 35 disposed at a layer different from layers of the first and second transmission lines 33 and 34, a first contact fuse 36 disposed between the first and second transmission lines 33 and 34 and connecting the first transmission lines 33 with the main transmission line 35, a second contact fuse 37 disposed between the second transmission line 34 and the main transmission line 35 and connecting the second transmission line 34 with the main transmission line 35, and a power driver 38 for changing a connection state such as a short state or an open state selected by selectively applying an electric stress to one of the first contact fuse 36 and the second contact fuse 37.

The first contact fuse 36 is inserted in a contact hole for connecting the first transmission line 33 with the main transmission line 35. The second contact fuse 37 is inserted into a contact hole for connecting the second transmission line 34 with the main transmission line 35. Since the contact hole is surrounded with an insulating material, a temperature of the contact fuse is abruptly increased by Joule heating when a stress current is applied. When the temperature of the contact fuse increases higher than a predetermined temperature, the contact fuse is melt down and finally discoupled. That is, the contact fuse becomes an electric open state. In the present embodiment, the first and second transmission lines 33 and 34 and the main transmission line 35 are a metallic transmission line disposed at a metal layer.

Therefore, when the power driver 38 applies the stress current to the first contact fuse 36 through a first stress current path STRESS CURRENT PATH1 which is formed of the main transmission line 35 and the first transmission line 33 or when the power driver 38 applies the stress current to the second contact fuse 37 through a second stress current path 2 formed of the main transmission line 35 and the second transmission line 34, the connection state of the contact fuse is changed from the short state to the open state. A signal transferred to the main transmission line 35 may be selected according to the electric connection states of the first and second contact fuses 36 and 37.

That is, a signal driven by the first signal driver 31 or a signal driven by the second signal driver 32 may be selectively transferred to the main transmission line 35. If the first and second signal drivers 31 and 32 have different internal delay values, a delay value of a signal transferred to the main transmission line 35 may be controlled through the electric connection state of the first and second contact fuses 36 and 37. If the first and second signal drivers 31 and 32 drive the input signal IN at the same time, a driving force of a signal transferred to the main transmission line 35 may be controlled through the electric connection state of the first and second contact fuses 36 and 37.

Hereinafter, a structure and an operation of the semiconductor device according to the third embodiment will be described in detail with reference to the equivalent circuit diagram 30B.

The power driver 38 includes current drivers MP1, MN1, and MN2 for applying a stress current to a contact fuse selected in response to a first fuse selection signal SEL1 and a second fuse selection signal SEL2. When a stress current driving signal /CFUSE_EN and a first fuse selection signal SEL1 are activated, the PMOS transistor MP1 and the first NMOS transistor MN1 are turned on and a stress current is applied to the first contact fuse C1. After the stress current is applied for a predetermined time, the first contact fuse C1 becomes an electric open state. When the stress current driving signal /CFUSE_EN and the second fuse selection signal SEL2 are activated, the PMOS transistor MP1 and the second NMOS transistor MN2 are turned on and the stress current is applied to the second contact fuse C2. After the stress current is applied for a predetermined time, the second contact fuse C2 becomes an electric open state.

Meanwhile, the first signal driver 31 drives an input signal IN to the first transmission line 33 and the second signal driver 32 drives an input signal IN to the second transmission line 34. The first transmission line 33 transfers a signal to the main transmission line 35 through the first contact fuse 36. The second transmission line 34 drives a signal to the main transmission line 35 through the second contact fuse 37. Therefore, when the first contact fuse 36 is in a short state and the second contact fuse 37 is in an open state, a signal driven by the first signal driver 31 is transferred to the main transmission line 35. When the first contact fuse 36 is in an open state and the second contact fuse 37 is in a short state, a signal driven by the second signal driver 32 is transferred to the main transmission line 35. Therefore, a signal driven by the first signal driver 31 or a signal driven by the second signal driver 32 may be selectively transferred to the main transmission line 35.

Figure 4:
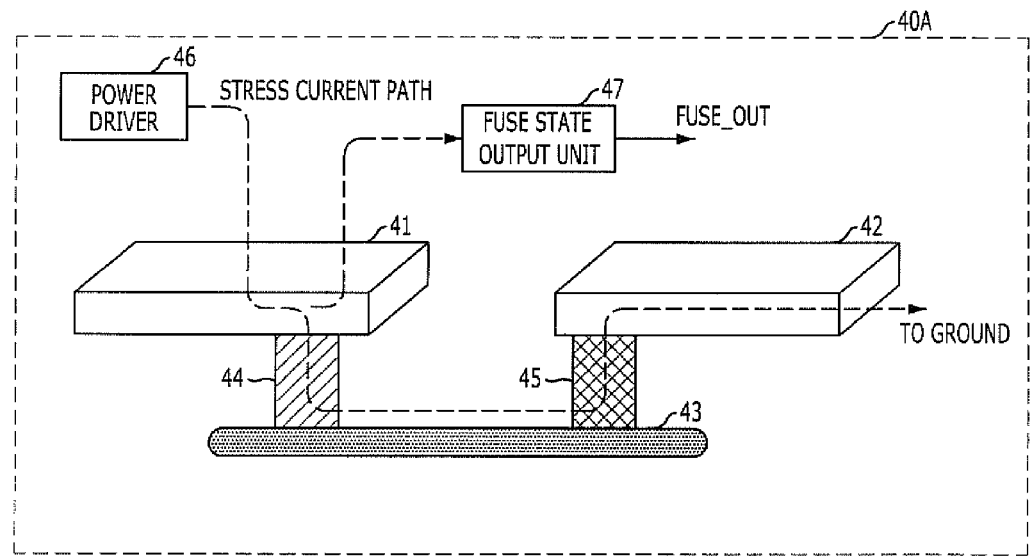
FIG. 4 illustrates a diagram 40A and an equivalent circuit diagram 40B of a semiconductor device in accordance with a fourth embodiment of the present invention.
Figure 4:
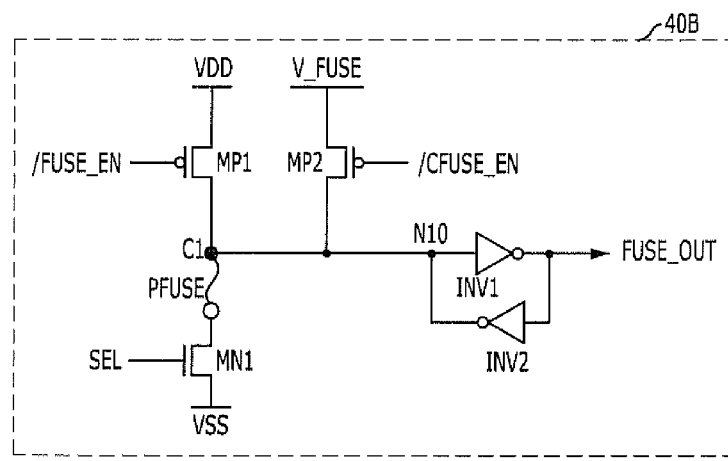

FIG. 4 illustrates a semiconductor device in accordance with a fourth embodiment of the present invention. FIG. 4 includes a diagram 40A and an equivalent circuit diagram 40B of the semiconductor device according to the fourth embodiment.

Referring to FIG. 4, the semiconductor device according to the fourth embodiment includes first and second transmission lines 41 and 42, a laser fuse 43 disposed at a layer different from layers of the first and second transmission lines 41 and 42, a contact fuse 44 for connecting one end of the laser fuse 43 to the first transmission line 41, a connection line 45 for connecting the other end of the laser fuse 43 to the second transmission line 42, a power driver 46 for applying an electric stress to the contact fuse 44, and a fuse state output unit 47 for outputting a fuse state signal FUSE_OUT having a logic level corresponding to an electric connection state of the contact fuse 44 such as a short state and an open state and an electric connection state of the laser fuse 43.

The contact fuse 44 is inserted into a contact hole for connecting one end of the laser fuse 43 to the first transmission line 41. Since the contact hole is surrounded with an insulating material, a temperature of the contact fuse 44 is abruptly increased by Joule heating when a stress current is applied. When the temperature of the contact fuse 44 increases higher than a predetermined temperature, the contact fuse 44 is melt down and finally discoupled. That is, the contact fuse 44 becomes an open state. In the present embodiment, the first and second transmission lines 41 and 42 are metallic transmission lines disposed at a metal layer. In general, the laser fuse 43 is disposed at the metal layer.

The electric connection state of the laser fuse 43 may be changed by melting the laser fuse 43 using a laser beam when the semiconductor device according to the fourth embodiment is in a wafer stage. Further, when the semiconductor device according to the fourth embodiment is in a package stage, the electric connection state of the contact fuse 44 may be changed by applying a stress current from the power driver 46 to the contact fuse 44 through a stress current path STRESS CURRENT PATH formed of the first and second transmission lines 41 and 42. Therefore, a fuse state signal FUSE_OUT having a logic level corresponding to the electric connection state of the contact fuse 44 and the electric connection state of the laser fuse 43 is outputted. It is preferable that the connection line 45 is configured to have electric characteristics not is changed by the electric stress.

Hereinafter, a structure and an operation of the semiconductor device according to the fourth embodiment will be described in detail with reference to the equivalent circuit diagram 40B.

The power driver 46 includes current drivers MP2 and MN1 for applying a stress current to a contact fuse C1 in response to a current driving signal /CFUSE_EN and a fuse selection signal SEL. When a stress current driving signal /CFUSE_EN is activated to a logic low level and the fuse selection signal SEL is activated to a logic high level, the PMOS transistor MP2 and the NMOS transistor MN1 are turned on and a stress current is applied to the contact fuse C1. After the stress current is applied for a predetermined time, the contact fuse C1 becomes an electric open state.

The fuse state output unit 47 includes fuse drivers MP1 and MN1 for applying a driving current to a contact fuse C1 and a laser fuse PFUSE in response to a fuse driving signal /FUSE_EN and a fuse selection signal SEL and latch units INV1 and INV2 for latching a fuse state signal FUSE_OUT corresponding to a magnitude of a current transferred through the contact fuse C1 and the laser fuse PFUSE.

When the semiconductor device is in a wafer stage, an internal operation according to the electric connection state of the laser fuse PFUSE is performed as follows. Here, it is assumed that the contact fuse C1 is in an electric short state.

In an initial stage such as a power up stage, a stress current driving signal /CFUSE_EN is inactivated to a logic high level and a fuse selection signal SEL is inactivated to a logic low level. Here, if the fuse driving signals /FUSE_EN is activated to a logic low level, the PMOS transistor MP1 is turned on and a driving current is applied to the contact fuse C1 and the laser fuse PFUSE. By the driving current, an electric potential of input nodes N10 of the latch units INV1 and INV2 increases. As a result, a logic low level fuse state signal FUSE_OUT is outputted.

If a fuse selection signal SEL is activated to a logic high level while a stress current driving signal /CFUSE_EN and a fuse driving signal /FUSE_EN are inactivated to a logic high level, the electric potential of input nodes N10 of the latch units INV1 and INV2 are decided by the electric connection state of the laser fuse PFUSE. That is, if the laser fuse PFUSE is in an electric open state, the electric potential of the input node N10 of the latch units INV1 and INV2 is sustained as a logic high level. Finally, a logic low level fuse state signal FUSE_OUT is outputted. On the contrary, if the laser fuse PFUSE is in an electric short state, the electric potential of the input node N10 of the latch unit INV1 and INV2 drops. Finally, a logic high level fuse state signal FUSE_OUT is outputted. That is, if the laser fuse PFUSE is in an electric open state, the electric potential of the input node N10 of the latch unit INV1 and INV2 increases because a current does not flow through the laser fuse PFUSE. If the laser fuse PFUSE is in an electric short state, the electric potential of the input node N10 of the latch unit INV1 and IN2 drops because a current flows to a ground voltage terminal VSS through the laser fuse PFUSE.

Hereinafter, an internal operation according to an electric connection state of a contact fuse C1 when a semiconductor device is in a package stage will be described. Here, it is assumed that the laser fuse PFUSE is electrically shorted.

In an initial stage such as a power up stage, a stress current driving signal /CFUSE_EN is inactivated to a logic high level and a fuse selection signal SEL is inactivated to a logic low level. Here, when the fuse driving signal /FUSE_EN is activated to a logic low level, the PMOS transistor MP1 is turned on and a driving current is applied to a contact fuse C1 and a laser fuse PFUSE. The electric potential of the input node N10 of the latch unit INV1 and INV2 increases by the driving current. Finally, a logic low level fuse state signal FUSE_OUT is outputted.

If the fuse selection signal SEL is activated to a logic high level while the stress current driving signal /CFUSE_EN is inactivated to a logic high level, the electric potential of the input node N10 of the latch unit INV1 and INV2 is determined by an electric connection state of the contact fuse C1. That is, the contact fuse C1 is in an electric open state, the electric potential of the input node N10 of the latch unit INV1 and INV2 is sustained to a logic high level. Finally, a logic low level fuse state signal FUSE_OUT is outputted. On the contrary, if the contact fuse C1 is electrically in a short state, the electric potential of the input node N10 of the latch unit INV1 and INV2 is dropped. Finally, a logic high level fuse state signal FUSE_OUT is outputted. That is, if the contact fuse C1 is in an electric open state, the electric potential of the input node N10 of the latch unit INV1 and INV2 increases because a current does not flow through the contact fuse C1. If the contact fuse C1 is in an electric short state, the electric potential of the input node N10 of the latch unit INV1 and INV2 drops because the current flows to the ground voltage terminal VSS through the contact fuse C1.

Finally, when one of the laser fuse PFUSE and the contact fuse C1 becomes an open state, a logic low level fuse state signal FUSE_OUT is outputted. When the contact fuse C1 of the laser fuse PFUSE becomes a short state, a logic high level fuse state signal FUSE_OUT is outputted. The semiconductor device according to the present embodiment can change an internal setup and an option using the contact fuse C1 even in a package stage.

Figure 5:
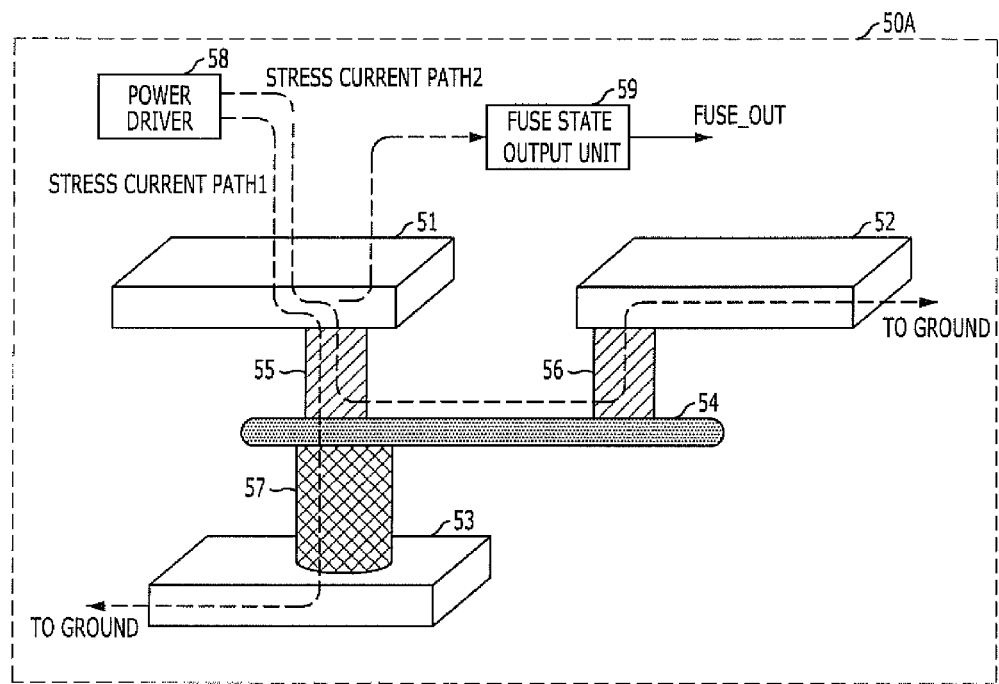
FIG. 5 illustrates a diagram 50A and an equivalent circuit diagram 50B of a semiconductor device in accordance with a fifth embodiment of the present invention.
Figure 5:
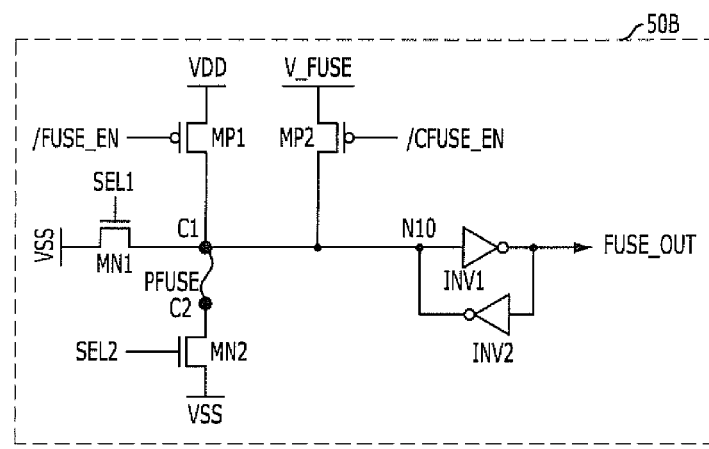

FIG. 5 illustrates a semiconductor device in accordance with a fifth embodiment of the present invention. FIG. 5 includes a diagram 50A and an equivalent circuit diagram 50B of the semiconductor device according to the fifth embodiment of the present invention.

Referring to FIG. 5, the semiconductor device according to the fifth embodiment includes first to third transmission lines 51, 52, and 53, a laser fuse 54 disposed at a layer different from layers of the first to third transmission lines 51, 52, and 53, a first contact fuse 55 for connecting one end of the laser fuse 54 with the first transmission line 51, a second contact fuse 56 for connecting the other end of the laser fuse 54 with the second transmission line 52, a connection line 57 coupled between the third transmission line 53 and one end or the other end of the laser fuse 54, a power driver 58 for selectively applying an electric stress to one of the first contact fuse 55 and the second contact fuse 56, and a fuse state output unit 59 for outputting a fuse state signal FUSE_OUT having a logic level corresponding to electric connection states of the first contact fuse 55 and the second contact fuse 56 such as a short state and an open state and an electric connection state of the laser fuse 54. In the present embodiment, the third transmission line 53 is disposed at a layer different from layers of the first transmission line 51, the second transmission line 52, and the laser fuse 54.

The first contact fuse 55 is inserted into a contact hole for connecting the first transmission line 51 with one end of the laser fuse 54. The second contact fuse 56 is inserted into a contact hole for connecting the second transmission line 52 with the other end of the laser fuse 54. Since the contact hole is surrounded with an insulating material, a temperature of the contact fuse is abruptly increased by Joule heating when a stress current is applied. When the temperature of the contact fuse increases higher than a predetermined temperature, the contact fuse is melt down and finally discoupled. That is, the contact fuse becomes an electric open state. For reference, the first to third transmission lines 51 to 53 are metallic transmission lines disposed in metal layer. In general, the laser fuse 54 is also disposed in a metal layer.

When the semiconductor device according to the fifth embodiment is in a wafer stage, an electric connection state of the laser fuse 54 can be changed by shorting the laser fuse 54 using a laser beam. When the semiconductor device according to the fifth embodiment is in a package stage, the connection state of the contact fuse is changed from a short state to an open state if the power driver 58 applies a stress current to the first contact fuse 55 through a first stress current path STRESS CURRENT PATH1 formed of the first and third transmission lines 51 and 53 or if the power driver 58 applies a stress current to the second contact fuse 56 through a second stress current path STRESS CURRENT PATH2 formed of the first and second transmission lines 51 and 52. Therefore, a fuse state signal FUSE_OUT having a logic level corresponding to the electric connection states of the first and second contact fuses 55 and 56 and the electric connection state of the laser fuse 54. For reference, it is preferable that the connection line 57 is configured not to change electric characteristics by an electric stress.

Hereinafter, a structure and an operation of the semiconductor device according to the fifth embodiment will be described in detail with reference to the equivalent circuit diagram 50B.

The power driver 58 includes current drivers MP2, MN1, and MN2 for applying a stress current to a contact fuse selected in response to a stress current driving signal /CFUSE_EN, a first fuse selection signal SEL1 and a second fuse selection signal SEL2. When the stress current driving signal /CFUSE_EN is activated to a logic low level and the first fuse selection signal SEL1 is activated to a logic high level, the PMOS transistor MP2 and the first NMOS transistor MN1 are turned on and a stress current is applied to the first contact fuse C1. When the stress current is applied form a predetermined time, the first contact fuse C1 becomes an electric open state. Also, when the stress current driving signal /CFUSE_EN is activated to a logic low level and the second fuse selection signal SEL2 is activated to a logic high level, the PMOS transistor MP2 and the second NMOS transistor MN2 are turned on and the stress current is applied to the second contact fuse C2. When the stress current is applied for a predetermined time, the second contact fuse C2 becomes an electric open state.

The fuse state output unit 59 includes fuse drivers MP1 and MN2 for providing a driving current to the first and second contact fuses C1 and C2 and the laser fuse PFUSE in response to the fuse driving signal /FUSE_EN and the second fuse selection signal SEL2, and latch units INV1 and INV2 for latching a fuse state signal FUSE_OUTPUT corresponding an magnitude of a current transferred through the first and second contact fuses C1 and C2 and the laser fuse PFUSE.

For reference, the internal operation of the semiconductor device according to the fifth embodiment of FIG. 5 is substantially identical to that of the semiconductor device according to the fourth embodiment of FIG. 4. Since the internal operation of the semiconductor device according to the fourth embodiment was described in detail as above, the same internal operation of the semiconductor device according to the fifth embodiment is omitted. Only specific structure and internal operation of the semiconductor device according to the fifth embodiment will be described hereinafter.

The semiconductor device according to the fifth embodiment can selectively apply a stress current to the first contact fuse C1 or the second contact fuse C2 by the first fuse selection signal SEL1 and the second fuse selection signal SEL2. Therefore, the contact fuse receiving the stress current becomes an electric open state. When the laser fuse PFUSE is shorted, the electric connection state of the second contact fuse C2 is not changed because the second stress current path STRESS CURRENT PATH2 is not formed. However, the first contact fuse C1 can receive a stress current through the first stress current path STRESS CURRENT PATH1 regardless of the connection state of the laser fuse PFUSE. Therefore, the laser fuse PFUSE, the first contact fuse C1, and the second contact fuse C2, may be selectively changed if it is necessary.

In conclusion, when one of the laser fuse PFUSE, the first contact fuse C1, and the second contact fuse C2 becomes an open state, a logic low level fuse state signal FUSE_OUT is finally outputted. When all of the laser fuse PFUSE, the first contact fuse C2, and the second contact fuse C2 become a short state, a logic high level fuse state signal FUSE_OUT is outputted finally. The semiconductor device according to the present embodiment can change internal setup and options using the laser fuse PFUSE in a wafer stage and using the first second contact fuses C1 and C2 in a package stage.

As described above, the contact fuse inserted into the contact hole occupies a small area compared to the physical fuse (Physical Fuse) and the electric fuse (E-FUSE). Therefore, the semiconductor device according to the present invention requires a small area for the contact fuse.

When the contact fuse according to the present embodiment is applied to a semiconductor device having a repair fuse set formed of a physical fuse, the semiconductor device can perform a repair process using a laser beam not only in a wafer stage but also in a package stage. That is, it is possible to perform a repair process using the contact fuse although a defect is found after a package process.

The semiconductor device according to the present embodiment can simply change setup and options of an internal circuit such as delay control and driver intensity control without significant revision.

While the present invention has been described with respect to the specific embodiments, it will be apparent to those skilled in the art that various changes and modifications may be made without departing from the spirit and scope of the invention as defined in the following claims.

In order to clearly describe the present invention, embodiments having additional structures may be exemplary described although these additional structures are not directly related to the technological concept and scope of the present invention. Configurations of Active High and Active Low for representing an activation state of a signal and a circuit may be changed according to embodiments. Further, a structure of a transistor may be changed for realizing the same function. That is, a structure of a PMOS transistor and an NMOS transistor may be replaced or may be embodied using various transistors. In order to realize the same function, a structure of a logic gate may be changed. That is, a NAND means and a NOR means may be formed of various combinations of a NAND gate, a NOR gate, and an inverter.

Particularly, a contact fuse according to embodiments of the present invention is formed as a blowing type that changes an electric connection state from a short state to an open state by an electric stress. However, in another embodiment, a contact fuse may be formed as an anti type that changes an electric connection state from an open state to a short state by an electric stress. In case of an anti type contact fuse, a power driver is configured to apply a high voltage stress to a contact fuse. Further, a contact fuse may be disposed at a part coupled to other material such as poly instead of disposed between metal layers. Since a contact fuse according to embodiments of the present invention is inserted into a contact hole, a location of disposing the contact fuse may be changed. Since a circuit may be modified in numerous ways and it is obvious to those skilled in the art that a location of a contact fuse is changed according to the modification of circuit, the detailed description thereof is omitted.

What is claimed is:

1. A semiconductor device, comprising:
   a first transmission line and a second transmission line disposed at different layers;
   a contact fuse coupled with the first transmission line and the second transmission line;
   a power driver configured to apply an electric stress to the contact fuse; and
   a fuse state output unit configured to output a fuse state signal having a logic level corresponding to an electric connection state of the contact fuse.

2. The semiconductor device of claim 1, wherein the contact fuse includes a fuse formed on a contact hole configured to connect the first transmission line with the second transmission line.

3. The semiconductor device of claim 1, wherein the first transmission line and the second transmission line are metal lines.

4. The semiconductor device of claim 1, wherein the power driver includes a current driver configured to apply a stress current to the contact fuse in response to a stress current driving signal and a fuse selection signal.

5. The semiconductor device of claim 1, wherein the fuse state output unit includes:
   a fuse driver configured to provide a driving current to the contact fuse in response to a fuse driving signal and a fuse selection signal; and
   a latch unit configured to latch the fuse state signal corresponding to an magnitude of a current transferred through the contact fuse.

6. A semiconductor device, comprising:
   a first transmission line;
   a second transmission line;
   a contact fuse coupled with the first transmission line and the second transmission line;
   a first signal driver configured to drive an input signal to the first transmission line;
   a second signal driver configured to drive the input signal to the second transmission line disposed at a layer different from a layer of the first transmission line; and
   a power driver configured to change an electric connection state of the contact fuse by applying an electric stress to the contact fuse.

7. The semiconductor device of claim 6, wherein the contact fuse includes a fuse formed on a contact hole for connecting the first transmission line and the second transmission line.

8. The semiconductor device of claim 6, wherein the first transmission line and the second transmission line are metal lines.

9. The semiconductor device of claim 6, wherein the power driver includes a current driver configured to apply a stress current to the contact fuse in response to a stress current driving signal.

10. A semiconductor device, comprising:
    a first transmission line;
    a second transmission line;
    a main transmission line disposed at a layer different from layers of the first transmission line and the second transmission line;
    a first contact fuse coupled with the first transmission line and the main transmission line;
    a second contact fuse coupled with the second transmission line and the main transmission line;
    a first signal driver configured to drive an input signal to the first transmission line;

a second signal driver configured to drive the input signal to the second transmission line; and a power driver configured to change an electric connection state of a selected contact fuse by selectively applying an electric stress to one of the first contact fuse and the second contact fuse as the selected contact fuse.

11. The semiconductor device of claim 10, wherein the first signal driver and the second signal driver have different internal delay values.

12. The semiconductor device of claim 10, wherein the first contact fuse includes a fuse formed on a contact hole for connecting the first transmission line with the main transmission line.

13. The semiconductor device of claim 12, wherein the second contact fuse includes a fuse formed on a contact hole for connecting the second transmission line with the main transmission line.

14. The semiconductor device of claim 10, wherein the first transmission line, the second transmission line, and the main transmission line are metal lines.

15. The semiconductor device of claim 10, wherein the power driver includes a current driver configured to supply a stress current to a contact fuse selected in response to a stress current driving signal, a first fuse selection signal, and a second fuse selection signal.

16. A semiconductor device, comprising:
a first transmission line and a second transmission line;
a laser fuse disposed at a layer different from layers of the first transmission line and the second transmission line;
a contact fuse configured to connect the first transmission line with one end of the laser fuse;
a connection line configured to connect the second transmission line with the other end of the laser fuse;
a power driver configured to selectively apply an electric stress to the contact fuse; and
a fuse state output unit configured to output a fuse state signal having a logic level corresponding to an electric connection state of the contact fuse.

17. The semiconductor device of claim 16, wherein the contact fuse includes a fuse formed on contact hole for connecting the first transmission line with one end of the laser fuse.

18. The semiconductor device of claim 16, wherein the first transmission line and the second transmission line are metal lines.

19. The semiconductor device of claim 18, wherein the laser fuse is disposed at a metal layer.

20. The semiconductor device of claim 16, wherein the power driver includes a current driver configured to apply a stress current to the contact fuse in response to a stress current driving signal and a fuse selection signal.

21. The semiconductor device of claim 16, wherein the fuse state output unit includes:
a fuse driver configured to provide a driving current to the contact fuse and the laser fuse in response to a fuse driving signal and a fuse selection signal; and a latch unit configured to latch the fuse state signal corresponding to a magnitude of a current transferred through the contact fuse and the laser fuse.

22. A semiconductor device, comprising:
a first transmission line, a second transmission line, and a third transmission line;
a laser fuse disposed at a layer different from layers of the first transmission line, the second transmission line, and the third transmission lines;
a first contact fuse configured to connect the first transmission line with one end of the laser fuse;
a second contact fuse configured to connect the second transmission line with the other end of the laser fuse;
a connection line coupled between the third transmission line and the one end of the laser fuse or between the third transmission line and the other end of the laser fuse;
a power driver configured to selectively apply an electric stress to one of the first contact fuse and the second contact fuse; and
a fuse state output unit configured to output a fuse state signal having a logic level corresponding to an electric connection state of the first and second contact fuses.

23. The semiconductor device of claim 22, wherein the first contact fuse includes a fuse formed on a contact hole for connecting the first transmission line with one end of the laser fuse.

24. The semiconductor device of claim 23, wherein the second contact fuse includes a fuse formed on a contact hole for connecting the second transmission line with the other end of the laser fuse.

25. The semiconductor device of claim 22, wherein the first transmission line, the second transmission line, and the third transmission line are metal lines.

26. The semiconductor device of claim 25, wherein the laser fuse is disposed at a metal layer.

27. The semiconductor device of claim 22, wherein the power driver includes a current driver configured to apply a stress current to a contact fuse selected in response to a stress current driving signal, a first fuse selection signal, and a second fuse selection signal.

28. The semiconductor device of claim 22, wherein the fuse state output unit includes:
a fuse driver configured to provide a driving current to the first contact fuse, the second contact fuse and the laser fuse in response to a fuse driving signal and a fuse selection signal; and
a latch unit configured to latch the fuse state signal corresponding to a magnitude of a current transferred through the first contact fuse, the second contact fuse, and the laser fuse.

29. The semiconductor device of claim 22, wherein the third transmission line is disposed at a layer different from layers of the first transmission line, the second transmission line, and the laser fuse.

* * * * *